(12) United States Patent
Bellman et al.

(10) Patent No.: US 10,410,883 B2
(45) Date of Patent: Sep. 10, 2019

(54) ARTICLES AND METHODS OF FORMING VIAS IN SUBSTRATES

(71) Applicant: CORNING INCORPORATED, Corning, NY (US)

(72) Inventors: Robert Alan Bellman, Painted Post, NY (US); Shiwen Liu, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/609,238

(22) Filed: May 31, 2017

(65) Prior Publication Data
US 2017/0352553 A1    Dec. 7, 2017

Related U.S. Application Data

(60) Provisional application No. 62/343,943, filed on Jun. 1, 2016.

(51) Int. Cl.
| | |
|---|---|
| *H01L 21/48* | (2006.01) |
| *C03C 17/30* | (2006.01) |
| *H01L 21/768* | (2006.01) |
| *H01L 21/308* | (2006.01) |
| *H01L 21/311* | (2006.01) |

(Continued)

(52) U.S. Cl.
CPC ............. *H01L 21/486* (2013.01); *B05D 1/60* (2013.01); *C03C 15/00* (2013.01); *C03C 17/22* (2013.01); *C03C 17/30* (2013.01); *C03C 23/0025* (2013.01); *C23C 16/27* (2013.01); *H01L 21/3081* (2013.01); *H01L 21/31144* (2013.01); *H01L 21/6835* (2013.01); *H01L 21/76898* (2013.01); *H01L 23/49827* (2013.01);

(Continued)

(58) Field of Classification Search
CPC ..... B05D 1/60; C23C 16/27; H01L 23/49827; H01L 23/49838; H01L 21/3081; H01L 21/31144; H01L 21/486; H01L 21/6835; H01L 21/76898; C03C 15/00; C03C 17/22; C03C 17/30; C03C 2204/08; C03C 2218/34; C03C 23/0025
USPC ..... 216/14, 41, 43, 46, 83, 99; 438/692, 693
See application file for complete search history.

(56) References Cited

U.S. PATENT DOCUMENTS

| | | |
|---|---|---|
| 8,411,459 B2 | 4/2013 | Yu et al. |
| 9,278,886 B2 | 3/2016 | Boek et al. |

(Continued)

FOREIGN PATENT DOCUMENTS

| | | |
|---|---|---|
| WO | 15113023 | 7/2015 |
| WO | 15157202 | 10/2015 |
| WO | 2016176171 | 11/2016 |

OTHER PUBLICATIONS

International Search Report and Written Opinion PCT/US2017/035346 dated Sep. 7, 2017.

*Primary Examiner* — Lan Vinh
(74) *Attorney, Agent, or Firm* — John P. McGroarty

(57) ABSTRACT

Methods of forming vias in substrates having at least one damage region extending from a first surface etching the at least one damage region of the substrate to form a via in the substrate, wherein the via extends through the thickness T of the substrate while the first surface of the substrate is masked. The mask is removed from the first surface of the substrate after etching and upon removal of the mask the first (Continued)

surface of the substrate has a surface roughness (Rq) of about less than 1.0 nm.

13 Claims, 4 Drawing Sheets

(51) Int. Cl.
    *B05D 1/00* (2006.01)
    *C23C 16/27* (2006.01)
    *H01L 21/683* (2006.01)
    *H01L 23/498* (2006.01)
    *C03C 15/00* (2006.01)
    *C03C 17/22* (2006.01)
    *C03C 23/00* (2006.01)

(52) U.S. Cl.
    CPC .... *H01L 23/49838* (2013.01); *C03C 2204/08* (2013.01); *C03C 2218/34* (2013.01)

(56) References Cited

U.S. PATENT DOCUMENTS

| | | | |
|---|---|---|---|
| 9,346,706 B2 | 5/2016 | Bazemore et al. | |
| 2004/0058476 A1* | 3/2004 | Enquist | B81C 1/00269 438/114 |
| 2005/0029238 A1 | 2/2005 | Chen | |
| 2005/0079650 A1* | 4/2005 | Mancini | B82Y 10/00 438/105 |
| 2005/0266320 A1* | 12/2005 | Amemiya | G03F 1/20 430/5 |
| 2009/0029189 A1* | 1/2009 | Moriwaki | B82Y 10/00 428/826 |
| 2011/0308942 A1* | 12/2011 | Liu | G01N 27/27 204/400 |
| 2012/0241919 A1* | 9/2012 | Mitani | H01L 21/76254 257/623 |
| 2012/0276743 A1 | 11/2012 | Won et al. | |
| 2013/0089701 A1* | 4/2013 | Hooper | B23K 26/00 428/131 |
| 2013/0330515 A1 | 12/2013 | Oh et al. | |
| 2013/0337599 A1* | 12/2013 | Yun | H01L 33/0079 438/47 |
| 2014/0147623 A1 | 5/2014 | Shorey et al. | |
| 2014/0166199 A1 | 6/2014 | Bellman et al. | |
| 2014/0170378 A1 | 6/2014 | Bellman et al. | |
| 2015/0166395 A1 | 6/2015 | Marjanovic et al. | |
| 2015/0306847 A1 | 10/2015 | Bellman et al. | |
| 2015/0329415 A1 | 11/2015 | Bellman et al. | |
| 2016/0107925 A1 | 4/2016 | Burket et al. | |
| 2016/0351410 A1* | 12/2016 | Fu | H01L 21/3088 |
| 2017/0036419 A1 | 2/2017 | Adib et al. | |

* cited by examiner

ARTICLES AND METHODS OF FORMING VIAS IN SUBSTRATES

CROSS-REFERENCE TO RELATED APPLICATIONS

This application claims the benefit of priority under 35 U.S.C. § 119 of U.S. Provisional Application Ser. No. 62/343,943 filed on Jun. 1, 2016 the content of which is relied upon and incorporated herein by reference in its entirety.

BACKGROUND

Field

The present disclosure generally relates to articles and methods of forming vias in substrates. In particular, the present disclosure is directed to articles and methods of forming through vias in substrates that include etching processes that preserve the surface roughness (Rq) of a substrate.

Technical Background

An interposer may be used as an electrical interface in an electronic device, including devices having a radio frequency (RF) filter, to spread an electrical connection to a wider pitch or to reroute an electrical connection to a different electrical connection. Glass interposers have become an attractive alternative to silicon and fiber reinforced polymers. This is due, in part, to the ability of glass to be formed in large thin sheets. However, with continuously thinner electronic devices, many applications require interposers to the have thicknesses of 300 µm or less. Such thin glass can be difficult to handle in fabrication procedures because of the glass's fragility and lack of stiffness. To counteract a glass substrate's fragility and lack of stiffness, fabrication methods using a carrier to which the glass substrate is bonded have been developed.

Van der Waals forces may be used to temporarily bond glass articles to carriers. The energy of the temporary bond is sufficient to survive flat panel fabrication, while remaining de-bondable. However, Van der Waals forces may produce weak bonds, if any, when the surface roughness (Rq) of the glass article is too high.

Typically, glass interposers require vias (holes) to be filled with electrically conductive material to provide electrical interfacing. A known method of creating vias in glass interposers is by creating a damage region through the thickness of the glass interposer and then submerging to substrate into an etchant. The etchant may then remove material from the damage region to enlarge the hole. However, the etching process is not selective and material may be removed from both faces of the glass interposer as well as enlarging the hole. This invariably creates a glass interposer surface roughness (Rq) outside of the range which Van der Waals bonds can be appropriately formed.

Accordingly, a need exists for methods for forming vias in substrates while preserving low surface roughnesses (Rq) such that the substrates may be removably bonded to carriers.

SUMMARY

In a first aspect, a method of forming a via in a substrate having at least one damage region extending from a first surface includes etching the at least one damage region of the substrate to form a via in the substrate while the first surface of the substrate is masked. The mask is then removed from the first surface of the substrate, and upon removal of the mask the first surface of the substrate has a surface roughness (Rq) of about less than 1.0 nm.

A second aspect according to the first aspect, wherein the mask is selected from a group consisting of diphenylsilicon, phenylsilicon, methylphenylsilicon, and diamond-like carbon (DLC).

A third aspect according to the second aspect, wherein the mask is DLC and the DLC is a hydrogenated amorphous carbon.

A fourth aspect according to any of the preceding aspects, wherein the first surface of the substrate has a surface roughness (Rq) of about less than 0.6 nm upon removal of the mask.

A fifth aspect according to any of the preceding aspects, wherein a second surface of the substrate opposite the first surface of the substrate is masked during etching.

A sixth aspect according to any of the preceding aspect, wherein the mask is removed by oxidation.

A seventh aspect according to any of the preceding aspects, wherein the via is a blind via or a through via.

An eighth aspect according to any of the preceding aspects, wherein the mask is selectively applied to the first surface of the substrate such that the damage region is unmasked.

A ninth aspect according to any of the preceding aspects, wherein the substrate is a glass, ceramic, or glass-ceramic.

A tenth aspect according to any of the preceding aspects, further including removably bonding the substrate to a carrier by disposing the first surface of the substrate on a bonding surface of the carrier.

An eleventh aspect according to the tenth aspect, further including, after removably bonding the substrate to the carrier, processing the substrate by at least one of applying alkaline cleaning solutions to the substrate, wet etching the substrate, polishing the substrate, metal plating the substrate, metal patterning the substrate by wet etching, depositing material onto the substrate, and annealing the substrate.

A twelfth aspect according to the eleventh aspect, further including removing the carrier from the substrate.

A thirteenth aspect according to any one of the tenth through twelfth aspects, wherein the mask is selectively applied to the first surface of the substrate such that the damage region is unmasked.

In a fourteenth aspect, an article includes a substrate including a first surface and a second surface separated by a thickness T. At least one damage region is within the substrate and extends from the first surface. A first film layer is disposed on an undamaged region of the first surface of the substrate. The first film layer is selected from a group consisting of diphenylsilicon, phenylsilicon, methylphenylsilicon, and diamond-like carbon (DLC).

A fifteenth aspect according to the fourteenth aspect, further including a second film layer disposed on the undamaged region of the second surface of the substrate, the second film layer selected from a group consisting of diphenylsilicon, phenylsilicon, methylphenylsilicon, and diamond-like carbon (DLC).

A sixteenth aspect according to the fourteenth or fifteenth aspect, wherein the first film is DLC and the DLC is a hydrogenated amorphous carbon.

In a seventeenth aspect according to any one of the fourteenth through sixteenth aspects, wherein the substrate is glass, ceramic, or glass-ceramic.

Additional features and advantages of the will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and are not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
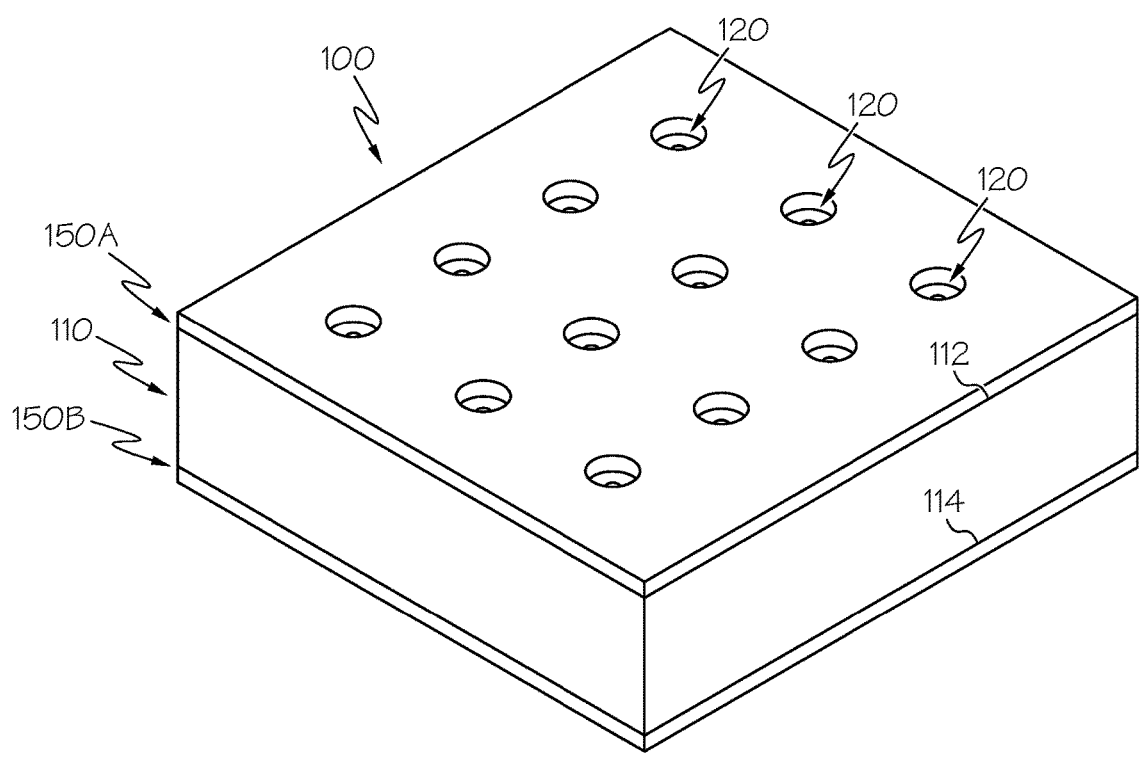
FIG. 1 illustrates a perspective view of an article including a substrate and a mask, according to one or more embodiments shown and described herein.

Referring generally to the figures, embodiments of articles and methods of creating vias in substrates provided herein allow for the preservation of surface roughness (Rq) of substrates so that the substrates may be removably bonded to carriers for further processing. Reference will now be made in detail to various embodiments of articles and methods of forming vias in substrates, examples of which are illustrated in the accompanying drawings. Whenever possible, the same reference numerals will be used throughout the drawings to refer to the same or like parts. It is noted that the embodiments illustrated in the figures are not to scale and that relative sizes and widths were selected for illustrative purposes only.

Embodiments preserve a pre-etch surface roughness of a substrate by utilizing mask layers during etching processes for via formation. By preserving the low surface roughness of the substrate during via formation, the substrate may be removably bonded to a carrier for further processing. After processing, the substrate may be removed from the carrier, such that the carrier may be reused for processing further substrates. Various embodiments of articles and methods for via formation are described in detail below.

FIG. 1 depicts an example article 100. The articles disclosed herein may be used, for example, as an interposer in a semiconductor package, the articles having etched holes (e.g., vias) and surface attributes which allow for successful downstream processing including, but not limited to, via metallization and application of redistribution layers (RDL) for semiconductor devices, radio-frequency (RF) devices (e.g., antennae, switches, and the like), interposer devices, microelectronic devices, optoelectronic devices, microelectronic mechanical system (MEMS) devices and other applications where vias may be leveraged.

Figure 2:
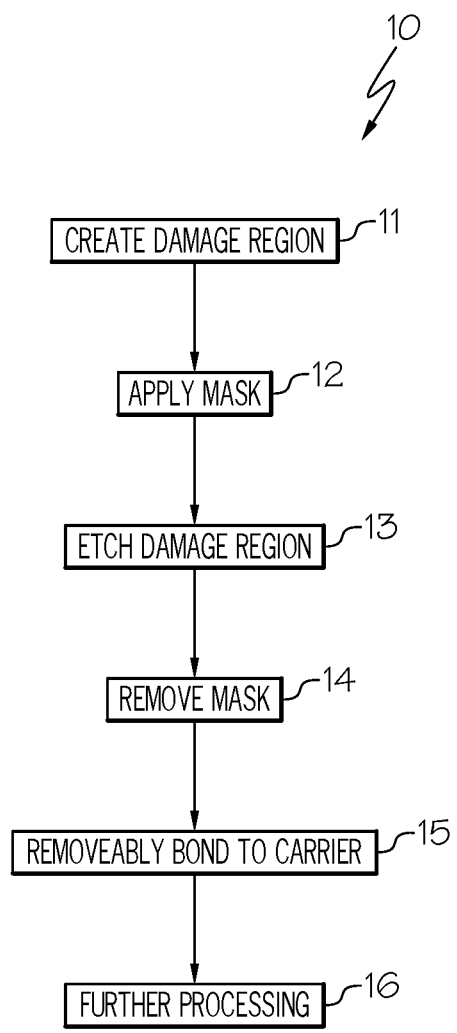
FIG. 2 illustrates a flowchart describing a method of making an article, according to one or more embodiments shown and described herein.

FIG. 2 depicts an exemplary flowchart 10 generally illustrating an example process for forming vias in substrates. The steps depicted in the flowchart will be described in greater detail throughout the description of the various figures. It is noted that though the flowchart 10 is depicted as having a certain order, it should be understood that embodiments of the present disclosure are not limited to the order of steps shown in FIG. 1.

Referring to FIG. 1, the article 100 generally includes a substrate 110. The substrate 110 has first and second surfaces 112, 114. At least one damage region 120 is shown on the first surface 112. First and second masks 150a, 150b are formed on at least one of the first and second surfaces 112, 114 of the substrate 110. In some embodiments, the a mask may only be formed on one of the first or second surface 112,114. In other embodiments, and as shown in FIG. 1, the first and second masks 150a, 150b are formed on both the first and second surfaces 112, 114 of the substrate 110. The substrate 110 may be formed from various glass compositions including, without limitation, borosilicate glasses, aluminosilicate glasses, alkali-aluminosilicate glasses, aluminoborosilicate glasses, alkali-aluminoborosilicate glasses, and soda lime glasses. Furthermore, the substrate 110 may be strengthened (e.g., by an ion exchange process) or non-strengthened. Exemplary substrates may include, but are not limited to, Corning EAGLE XG® glass, chemically strengthened or non-strengthened Corning Gorilla® glass, and Corning Willow® glass. In yet further embodiments, the substrate 110 may be made from other materials such as ceramic and glass ceramic.

Figure 3:
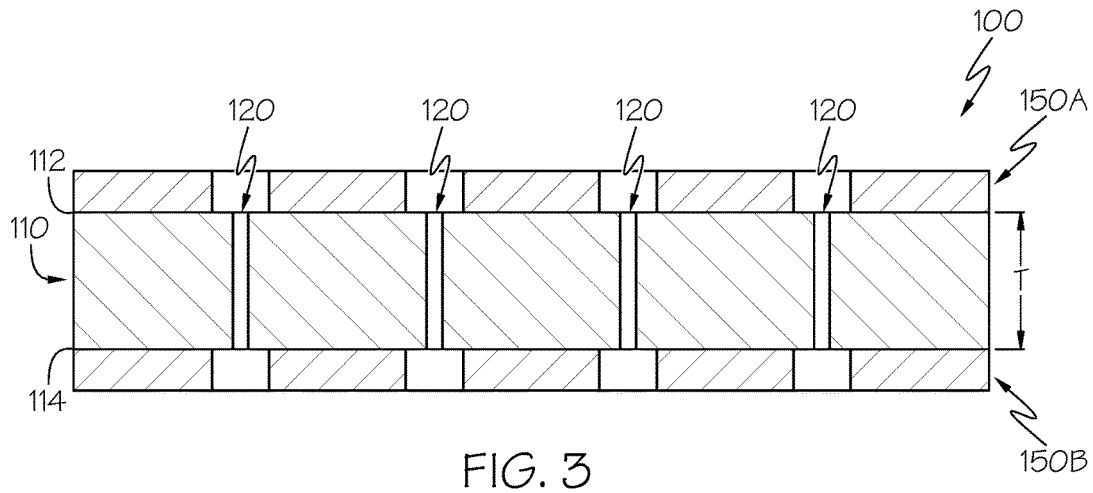
FIG. 3 illustrates a cross-sectional view of the article of FIG. 1 with one or more damage regions formed therein, according to one or more embodiments shown and described herein.

Referring now to FIG. 3, the first and second surfaces 112, 114 of the substrate 110 may be separated by a thickness T, which may depend on the application and is not limited by this disclosure. As non-limiting examples, the thickness T may be in a range of from about 25 µm to about 3,000 µm, about 25 µm to about 2,000 µm, about 25 µm to about 1,000 µm, about 50 µm to about 3,000 µm, about 50 µm to about 2,000 µm, about 50 µm to about 1,000 µm, about 100 µm to about 3,000 µm, about 100 µm to about 2,000 µm, about 100 µm to about 1,000 µm, about 200 µm to about 3,000 µm, about 200 µm to about 2,000 µm, about 200 µm to about 1,000 µm, about 500 µm to about 3,000 µm, about 500 µm to about 2,000 µm, about 500 µm to about 1,000 µm, about 3,000 µm or less, about 2,000 µm or less, about 1,000 µm or less, about 700 µm or less, about 500 µm or less, about 400 µm or less, about 300 µm or less, about 200 µm or less, or about 100 µm or less. The first and second surfaces 112, 114 also have a pre-etch surface roughness (Rq). Surface roughness (Rq) refers to the Root Mean Square (RMS) of a surface's measured microscopic peaks and valleys. The surface roughness (Rq) may be measured using an atomic force microscope (AFM), for example a Veeco Dimension Icon. The surface roughness (Rq) may change in response to processing steps, such as the etching processing described below. This may be more apparent in the examples provided below.

Referring to block 11 of FIG. 2, the at least one damage region 120 is created in the substrate 110. As indicated in FIG. 3, the at least one damage region 120 extends through the thickness T of the substrate 110. The at least one damage region 120 may be a hole extending through the thickness T of the substrate 110. In some embodiments, the at least one damage region 120 does not extend through the entire thickness of the substrate. In some embodiments, there is a combination of damage regions that extend through the thickness T of the substrate with damage regions that do not extend through the entire thickness of the substrate. The at least one damage region 120 may be formed with in the substrate 110 in a variety of ways. In some embodiments, the at least one damage region 120 may be created applying a high energy laser pulse to ablate a narrow hole through the substrate 110. The at least one damage region 120 allows etchant to flow therein during downstream etching processes.

In another example, the at least one damage region 120 may not be a hole through the thickness T of the substrate 110 but rather a line of laser-induced damage formed by a pulsed laser. The pulsed laser may form the damage line by non-linear multi-photon absorption, for example. The rate of material removal within the line of laser-induced damage defining the at least one damage region 120 is faster than the rate of material removal outside of the at least one damage region 120 during the etching process. Exemplary ways for performing the laser damage creation and subsequent etching are disclosed in U.S. Pat. No. 9,278,886 and U.S. Pub. No. 2015/0166395, each of which is hereby incorporated by reference in its entirety.

At block 12 of the flowchart 10 of FIG. 2, first and second masks 150a, 150b may be applied to the first and second surfaces 112, 114 of the substrate 110, respectively. In some embodiments, the first and second masks 150a, 150b are indiscriminately applied to the substrate 110. In such embodiments, the first and second masks 150a, 150b may be applied to the substrate before the at least one damage region 120 is created in the substrate 110, as described above. In such a case, a laser pulse may ablate a hole through the first and second masks 150a, 150b and the substrate 110. In other embodiments, the first and second masks 150a, 150b are indiscriminately applied to the substrate after the at least one damage region has been created. In this instance, the first and second masks 150a, 150b may be selectively removed from the already created at least one damage region 120 prior to further processing. In yet further embodiments, the first and second masks 150a, 150b are selectively applied to the substrate 110. In such embodiments, the first and second masks 150a, 150b may be applied to the substrate 110 so as to avoid the already created at least one damage region 120. As such, the first and second masks 150a, 150b may have openings that are aligned with the at least one damage region 120 to allow etchant to access the at least one damage region 120. The first and second masks 150a, 150b may be applied in thicknesses of less than or equal to 1 μm. In some embodiments, the mask 150a, 150b may be applied in thicknesses of less than or equal to 300 nm. In yet further embodiments, the mask 150a, 150b may be applied in a thickness of about 60 nm.

The first and second masks 150a, 150b may be a variety of materials. For example, and without limitation, the mask may be made from diphenylsilicon, phenylsilicon, methylphenylsilicon, and diamond-like carbon (DLC). In some embodiments, the diamond-like carbon may be hydrogenated amorphous carbon. Such hydrogenated amorphous carbon films may be formed by depositing a hydrocarbon precursor compound such as compounds of formula $C_nH_y$, wherein n is 1 to 6 and y is 2 to 14. In some examples, n is 1 to 4 and y is 2 to 10. The hydrocarbon compounds can be linear or branched. In some examples, the coating layer formed by depositing a hydrocarbon precursor compound has a combined carbon and hydrogen content of at least 80 weight percent, at least 85 weight percent, at least 90 weight percent, or at least 95 weight percent. In some examples, the precursor compound is deposited to form the coating layer has a combined carbon and hydrogen content of at least 80 weight percent, at least 85 weight percent, at least 90 weight percent, at least 95 weight percent, at least 98 weight percent, at least 99 weight percent, or greater than 99.5 weight percent.

Examples of hydrocarbon precursor compounds include alkanes. An alkane can include methane, ethane, propane, butane, pentane and hexane. In some examples, the hydrocarbon precursor compounds include at least one carbon-carbon double bond, for example, an alkene. An alkene can include ethylene, propylene, butylene, pentene and hexene. The carbon-carbon double bond in the alkene can be present at various positions in the compound, for instance, but-1-ene or but-2-ene. In yet other examples, the hydrocarbon precursor compounds includes at least one carbon-carbon triple bond, for example, an alkyne. An alkyne can include ethyne, propyne, butyne, pentyne and hexyne. In some examples, the carbon-carbon triple bond in the alkyne is present at various positions in the compound, for instance, 1-butyne or 2-butyne.

It is contemplated that the first and second masks 150a, 150b may all be the same material. In other embodiments, the first and second masks 150a, 150b may be different materials. In embodiments wherein the mask material is diphenylsilicon, a diphenylsilicon film may be applied to at least one of the first and second surfaces 112, 114 of the substrate 110. Wherein the diphenylsilicon film is applied to both of the first and second surfaces 112, 114 there is a first diphenylsilicon film layer and a second diphenylsilicon film layer. Furthermore, though not shown, the diphenylsilicon film may be applied to edge surfaces of the substrate 110. The film may be applied by vapor deposition, for example. By way of example and not limitation, diphenylsilicon film is formed from diphenylsilane and hydrogen by chemical vapor deposition, preferably plasma enhanced chemical vapor deposition. Diphenylsilicon is a highly effective masking material and is resistant to acid erosion. As such, diphenylsilicon can withstand contact with hydrofluoric-mineral acid mixtures commonly used in etching processes. Furthermore, diphenylsilicon may be readily removed from glass surfaces without creating excessive surface roughness (Rq).

In embodiments, the mask material is hydrogenated amorphous carbon a hydrogenated amorphous carbon film may be applied to at least one of the first and second surfaces 112, 114 of the substrate 110. Wherein the hydrogenated amorphous carbon film is applied to both of the first and second surfaces 112, 114 there is a first hydrogenated amorphous carbon film layer and a second hydrogenated amorphous carbon film layer. The hydrogenated amorphous carbon may be deposited by chemical vapor deposition (CVD) techniques, and like methods. Specific examples of CVD techniques include CVD, low pressure CVD, atmospheric pressure CVD, Plasma Enhanced CVD (PECVD), atmospheric plasma CVD, atomic layer deposition (ALD), plasma ALD, and chemical beam epitaxy. In another example, the coating layer can be deposited by a pyrolytic torch at temperatures above 600° C., above 800° C., or above 1,000° C., including any ranges and subranges therebetween. A gas mixture for forming the coating layer, which contains the hydrocarbon compound, may also comprise a controlled amount of another compound, for example, a carrier gas or working gas. The other compound can include air, oxygen, nitrous oxide, carbon dioxide, water vapor, or hydrogen peroxide, and/or one or more an inert gas, for example, helium, neon, argon, krypton, xenon.

One of the biggest challenges of any selective etching process in which a mask is used is mask removal. The mask material must be tough enough to resist etching, but also must be readily removable without damaging the substrate. Polymer masks, such as photoresist, usually involve soaking the masked substrate in hot solvents with mechanical agitation. Often, inorganic masks are removed by plasma etching. For example, PECVD deposited silicon carbine (SiC) is generally removed with a fluorine containing plasma. However, under such a process, the substrate is also etched during removal, thus increasing the surface roughness (Rq) of the substrate. Diphenylsilicon is unique to traditional masking materials in that it is particularly susceptible to oxidation. During oxidation, the organic groups are pyrolized and removed and the silicon is oxidized to form silicon dioxide. This process allows for the surface roughness of the substrate to be substantially preserved. As shown in Example 3 below, hydrogentated amorphous carbons may also be oxidized to remove the mask. It is contemplated that other plasma polymer films and materials may have substantially similar benefits to diphenylsilicon. For example, and not a limitation, phenylsilicon, methylphenylsilicon, and diamond-like carbon (DLC).

Figure 4:
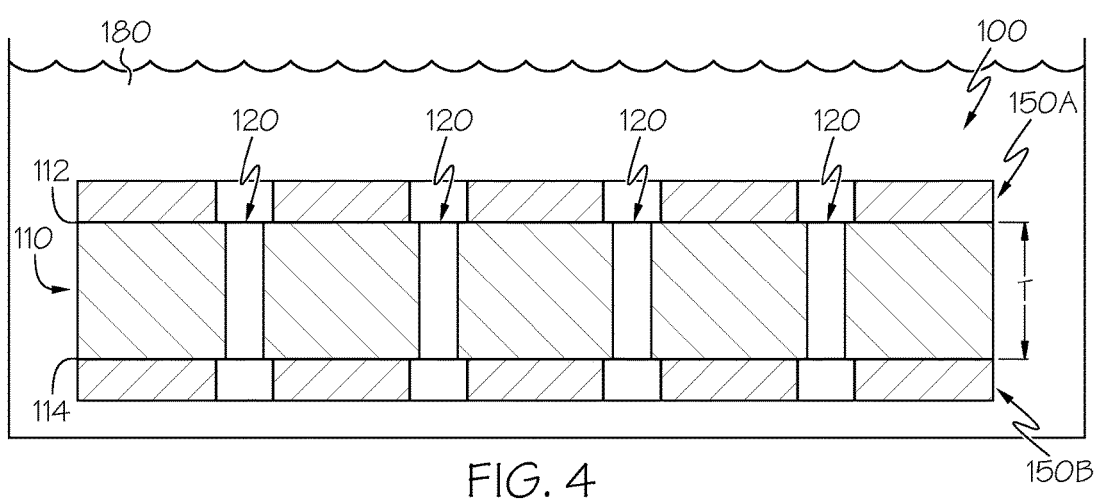
FIG. 4 illustrates the article of FIG. 1 dipped in an etchant, according to one or more embodiments shown and described herein.

Referring to block 13 of the flowchart 10 of FIG. 2, after the at least one damage region 120 has been created and the first and second masks 150a, 150b have been applied, the glass article 100 may be etched. As shown in FIG. 4, etching processes may include submerging the glass article 100 in an etchant 180 bath. Additionally or alternatively, the etchant 180 may be sprayed onto the glass article 100. The etchant 180 may remove material of the substrate 110 at the unmasked portions of the substrate 110 to enlarge a diameter of the at least one damage region 120. Any suitable etchants may be utilized. Non-limiting examples of etchants include strong mineral acids such as nitric acid, hydrochloric acid, or phosphoric acid with a fluorine containing etchant such as hydrofluoric acid, ammonium bifluoride, sodium fluoride, and the like.

Figure 5:
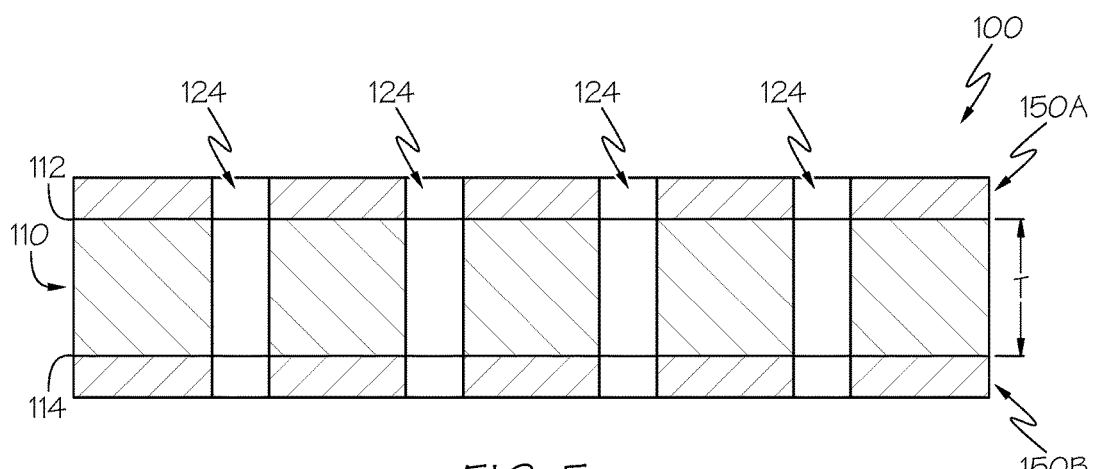
FIG. 5 illustrates a cross-sectional view of the article of FIG. 1 with one or more vias formed therein, according to one or more embodiments shown and described herein.

FIG. 5 illustrates the substrate 110 after etching has occurred. As depicted, a via 124 is opened from the at least one damage region 120 illustrated in FIG. 1. Via 124 is shown a being a through via that extends through the thickness of the substrate. In other embodiments, the via may be a blind via extending only a portion of the way through the substrate. In some embodiments, through vias are formed from damage regions that extend through the thickness of the substrate and the blind vias are formed from damage regions that do not extend through the thickness of the substrate. As an example and not a limitation, the via 124 may have a diameter in a range from about 5 µm to about 150 µm, about 20 µm to about 150 µm, or about 5 µm to about 20 µm. The via may be substantially cylindrical, for example having a waist (point along the via with the smallest diameter) with a diameter that is at least 70%, at least 75%, or at least 80% of the diameter of an opening of the via on the first or second surface.

Figure 6:
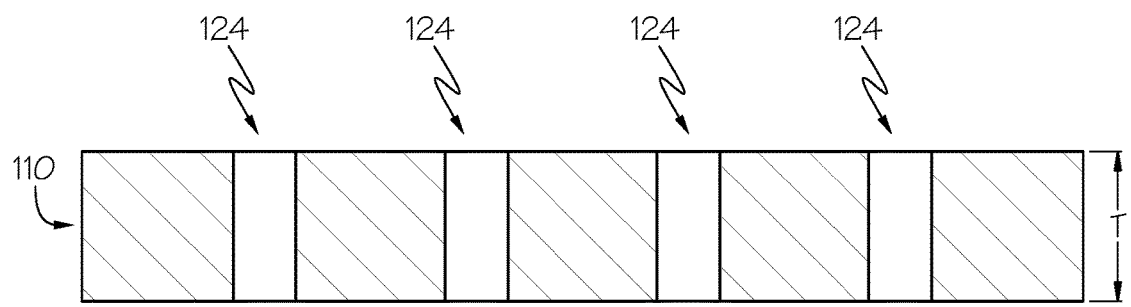
FIG. 6 illustrates a cross-sectional view of the article of FIG. 4 with the mask removed, according to one or more embodiments shown and described herein.

After the at least one via 124 has been opened to a desired diameter, the first and second masks 150a, 150b may be removed from the substrate 110 (block 14 of FIG. 2). FIG. 6 illustrates the first and second masks 150a, 150b having been removed from the substrate 110. In some embodiments, the substrate 100 may be cleaned prior to and/or after removing the first and second masks 150a, 150b (e.g., by rinsing with deionized water). For example and not a limitation, in embodiments wherein diphenylsilicon is the mask material, the first and second masks 150a, 150b may be removed by oxidation. Example tools for oxidizing diphenylsilicon film includes oxygen photoresist strippers or plasma ashers. The mask 150a, 150b may be removed without substantially increasing the surface roughness (Rq) of the first and second surfaces 112, 114 of the substrate 110 (i.e., post-etch surface roughness (Rq)). Substantially increasing the surface roughness (Rq) refers to increasing the surface roughness (Rq) of the substrate 110 beyond Van der Waal bonding capability as described herein. In some instances the resulting surface roughness (Rq) of the substrate 110 after removing the mask 150a, 150b is less than about 1.2 nm, less than about 1.1 nm, less than about 1.0 nm, less than about 0.9 nm, less than about 0.8 nm, less than about 0.7 nm, less than about 0.6 nm, less than about 0.5 nm, less than about 0.4 nm, or less than about 0.3 nm.

Figure 7:
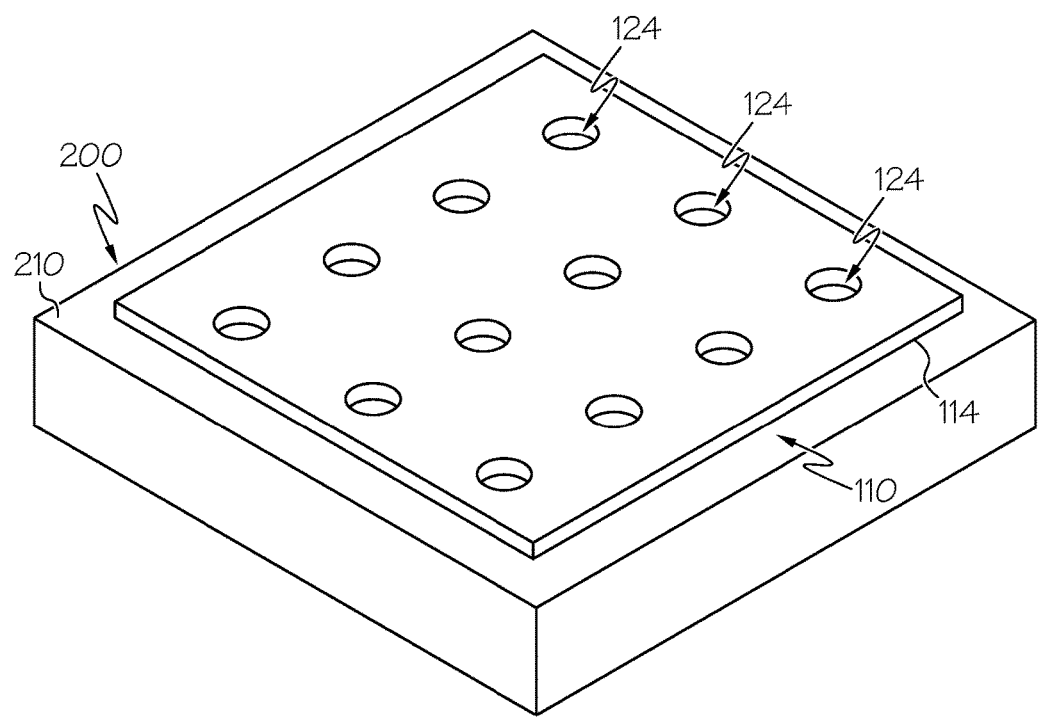
FIG. 7 illustrates a perspective view of the article of FIG. 6 bonded to a carrier, according to one or more embodiments shown and described herein.

After the via 124 has been etched, the substrate 110 may be subjected to additional processing steps for acquiring additional interposer properties. FIG. 7 illustrates an example substrate 110 removably bonded to an example carrier 200 by disposing the second surface 114 of the substrate 110 on a bonding surface 210 of the carrier 200. As discussed above, glass interposers may be very thin (e.g., anywhere from less than 300 µm to 700 µm). Such thin material may be difficult to handle during fabrication procedures because of the fragility and lack of stiffness of the substrate 110. To counteract the fragility and lack of stiffness, the substrate 110 may be removably bonded to the carrier 200 after the vias have been formed and the first and second masks 150a, 150b have been removed. One exemplary method of removably bonding a substrate 110 to a carrier is by using Van der Waals bonding such as disclosed by U.S. Patent Publication No. 2014/0170378, which is hereby incorporated by reference in its entirety. Van der Waals bonding generally includes disposing a surface of an article on a bonding surface of a carrier and raising a temperature of the article followed by cooling the article to room temperature. The result is the article and the carrier being removably bonded together. Van der Waals bonding is beneficial to downstream processing because of its ability to form bonds that are capable of withstanding processing (e.g., high temperature processing), while allowing the entire area of the substrate to be removed (either all at once, or in sections) from the carrier 200. After the substrate 110 has been removed, the carrier 200 may be reused for processing additional substrates.

However, the challenge of using Van der Waals surface bonding techniques for bonding substrates is that the roughness of the surfaces' being bonded together impacts the ability of the surfaces to be bonded. As a non-limiting example, surface roughness (Rq) greater than about 1.0 nm may substantially prevent spontaneous bonding or result in weak bonding of the substrate 110 to the carrier 200. Weak bonding may permit liquids from one or more processes to infiltrate between the substrate 110 and the carrier 200, thereby leading to de-lamination or to process contamination as residue from one process may impact later processes.

The carrier 200 may be of any suitable material, such as glass, for example. The carrier 200 need not be glass, but instead may be ceramic, glass-ceramic, or metal, for example. If made of glass, the carrier 200 may be of any suitable composition including, but not limited to, aluminosilicate, borosilicate, aluminoborosilicate, soda lime silicate, and may be either alkali containing or alkali-free depending upon its ultimate application. The carrier 200 may have any suitable thickness. Additionally, the carrier 200 may be made of one layer, as shown, or multiple layers (including multiple thin sheets) that are bonded together (e.g., by lamination). Furthermore, the coefficient of thermal expansion of the carrier 200 may be substantially matched with that of the substrate 110 to prevent warping of the substrate 110 or decoupling of the substrate 110 from the carrier 200 during processing at elevated temperatures. The surface roughness (Rq) of the substrate 110 is additive to the surface roughness of the carrier 200. Therefore, it is generally recommended that the carrier 200 have a surface roughness (Rq) less than or equal to 0.6 nm.

Referring to block 16 of FIG. 2, once the substrate 110 is sufficiently bonded to the carrier 200 such that the carrier 200 and the substrate 110 will not separate during processing, the substrate 110 may be subjected to further processing. Processing the substrate 110 may include steps such as applying alkaline cleaning solutions to the substrate 110, wet etching the substrate 110, polishing the substrate 110, metal plating the substrate 110, metal patterning the substrate 110 by wet etching, depositing material onto the substrate 110 by deposition, and annealing the substrate 110.

EXAMPLES

The following Comparative Example and Examples 1 and 2 compare changes in surface roughness (Rq) as a result of acid etching and the removal of diphenylsilicon films. In each example, the glass samples were 0.7 mm thick and did not have damage regions. The surface roughness (Rq) of each sample was measured by a Veeco Dimension ICON AFM with the following parameters: 1 Hz, 512 scans/line, and 2 micron image size.

Comparative Example

In this comparative example, the surface roughness (Rq) of an unmasked Eagle XG® glass sample was measured periodically while the glass sample was etched by a 6M hydrofluoric and 1.6M nitric acid mixture. It was established that surface roughness (Rq) greater than 1 nm is achieved in less than 10 minutes at room temperature with mechanical (non-ultrasonic) agitation. This amount of time corresponded to an etching depth of 40 μm. The results are tabulated in TABLE 1 below. It is noted that surface roughness's (Rq) in some instances of over 1.0 nm may lead to weak or ineffectual Van der Waals bonding.

TABLE 1

| | Time | | |
|---|---|---|---|
| | 5 minutes | 10 minutes | 15 minutes |
| Surface Roughness (Rq) | 1.11 nm | 1.67 nm | 1.46 nm |

Example 1

In this example, the surface roughness (Rq) of an Eagle XG® glass sample was measured before application, after application, and after removal of a diphenylsilicon film. The diphensylsilicon film was deposited in an Applied Materials P5000 Universal Chemical Vapor Deposition (CVD) System with the following parameters: 390° C., volumetric flow rate of 500 sccm diphenylsilicane, volumetric flow rate of 600 sccm Hydrogen ($H_2$), 9 torr, 210 mils. gap, 300 W RF, diphenylsilane bubbler at 80° C. The diphenylsilicon film had a thickness of 60 nm. The diphenylsilicon film was removed by a Gasonics L3510 photoresist stripper having the following parameters: 200° C., 1200 mT, 1000 sccm N2, 100 sccm O2, 900 W, 2.54 GHz, endpoint control with 30 sec. over-etch. The results, tabulated below in TABLE 2, illustrate the surface roughness (Rq) increasing only slightly, while still being well within the range required for Van der Waals bonding as described above. It is noted that the glass substrate was not subjected to acid etching in this example.

TABLE 2

| | Status | | |
|---|---|---|---|
| | Before Application | After Application | After Removal |
| Surface Roughness (Rq) | 0.193 nm | 0.298 nm | 0.272 nm |

Example 2

In this example, the surface roughness (Rq) of an Eagle XG® glass sample was measured after application of the diphenylsilicon film, after 15 minutes of etching, and after removal of a diphenylsilicon film. As in example 1, the diphensylsilicon film was deposited in an Applied Materials P5000 Universal CVD System with the following parameters: 390° C., volumetric flow rate of 500 sccm diphenylsilicane, volumetric flow rate of 600 sccm Hydrogen ($H_2$), 9 torr, 210 mils. gap, 300 W RF, diphenylsilane bubbler at 80° C. The diphenylsilicon film had a thickness of 60 nm. The etchant was a mixture of by a 3M hydrofluoric acid and 1M nitric acid and incorporated mechanical (non-ultrasonic) agitation. As in the above example, the diphenylsilicon film was removed by a Gasonics L3510 photoresist stripper having the following parameters: 200° C., 1200 mT, 1000 sccm N2, 100 sccm O2, 900 W, 2.54 GHz, endpoint control with 30 sec. over-etch. The results, tabulated below in TABLE 3, illustrate the surface roughness (Rq) being well within the range required for Van der Waals bonding as described above. This example also illustrates diphenylsilicon's resistance to acid erosion as discussed herein.

TABLE 3

| | Status | | |
|---|---|---|---|
| | After Application | After 15 Minute Etch | After Removal |
| Surface Roughness (Rq) | 0.269 nm | 0.259 nm | 0.201 nm |

Example 3

In this example, 6 samples of Eagle XG® glass wafers having a 0.7 mm thickness, a diameter of 150 mm and no damage regions had an amorphous hydrogenated carbon film mask applied. The mask was deposited from ethylene and hydrogen in a Nextral NE500 reactive ion etcher under the conditions of 30 sccm ethylene, 70 sccm hydrogen, at a pressure of 60 mT, at a power of 800 W and a frequency of 13.56 MHz. The deposition time and thickness of the mask (as deposited) is listed in Table 4 below. The index of refraction of the mask was also measured (as deposited) at 632 nm. The thickness and index of refraction were measured using a N&K analyzer. After depositing the mask, the samples were etched for approximately 15 minutes at 23° C. in an etching solution of 10 wt % hydroflouric acid and 7 wt % nitric acid. The thickness of the mask and the index of refreaction at 632 nm was measured again after etching using a N&K analyzer and are listed in Table 4 below. The changes in thickness and index were within the range of experimental error. Next the mask was removed by a Gasonics L3510 photoresist stripper having the following parameters: 200° C., 1200 mT, 1000 sccm N2, 100 sccm O2, 900 W, 2.54 GHz, endpoint control with 30 sec. over-etch. and the surface roughness (Rq) of each sample was measured by a Veeco Dimension ICON AFM with the following parameters: 1 Hz, 512 scans/line, and 2 micron image size. The results are listed in Table 4 below.

As can be seen in Table 4, Sample 7 did not have a mask and was etched under the same conditions as the six samples with the mask. The surface roughness (Rq) of the unmasked Sample 7 was significantly higher 1.13 compared to 0.240 to 0.278. This demonstrates that the mask

TABLE 4

| Sample | Deposition Time (s) | Thickness (nm) as deposited | Thickness (nm) after etching | Refractive Index at 632 nm as deposited | Refractive Index at 632 nm etching | Rq (nm) After removal |
|---|---|---|---|---|---|---|
| 1 | 30 | 22.86 | 23.78 | 1.809 | 1.791 | 0.278 |
| 2 | 59 | 33.52 | 32.85 | 2.001 | 2.013 | 0.241 |
| 3 | 89 | 46.02 | 46.14 | 2.066 | 2.065 | 0.267 |
| 4 | 160 | 76.93 | 76.63 | 2.119 | 2.119 | 0.257 |
| 5 | 178 | 80.81 | 80.39 | 2.120 | 2.119 | 0.240 |
| 6 | 237 | 110.80 | 110.90 | 2.118 | 2.120 | 0.248 |
| 7 | 0 | 0 | 0 | 0 | 0 | 1.13 |

Other materials provided herein may be deposited on substrates using an Applied Materials P5000 Universal CVD System having similar parameters. For example, phenylsilicon films may deposited from organosilicon hydride precursors with a hydrogen carrier gas in an Applied Materials P5000 Universal CVD system from phenylsilane and hydrogen with the following conditions: 390° C., volumetric flow rate of 120 sccm phenylsilane, and volumetric flow rate of 600 sccm Hydrogen ($H_2$), 9 Torr. pressure, 210 mils. gap, and 300 W 13.56 MHz RF. The phenylsilane ampoule may be at 30° C. The deposition rate may be nearly 1000 nm/min. Methylphenylsilicon films may deposited us a Applied Materials P5000 Universal CVD System with the following process conditions: 390° C., volumetric flow rate of 200 sccm methylphenylsilane, volumetric flow rate of 600 sccm Hydrogen ($H_2$), 9 torr, 210 mils. gap, and 450 W RF. The methylphenylsilane ampoule may be at 80° C. Other precursors such as organosilicon halides would produce similar results.

It should be understood that embodiments described herein provide for forming vias in substrates without substantially increasing the surface roughness (Rq) of the substrate. By preserving the low surface roughness of the substrate during via formation, the substrate may be removably bonded to a carrier for further processing. After processing, the substrate may be removed from the carrier, such that the carrier may be reused for processing further substrates. Furthermore, the through vias may be made substantially cylindrical because they may be etched from both ends.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A method of forming a via in a substrate having at least one damage region extending from a first surface, the method comprising:
    etching the at least one damage region of the substrate to form a via in the substrate while the first surface of the substrate is masked; and
    removing the mask from the first surface of the substrate, wherein the first surface of the substrate has a surface roughness (Rq) of less than about 1.0 nm upon removal of the mask.

2. The method of claim 1, wherein the mask is selected from the group consisting of diphenylsilicon, phenylsilicon, methylphenylsilicon, and diamond-like carbon (DLC).

3. The method of claim 2, wherein the mask is DLC and the DLC is a hydrogenated amorphous carbon.

4. The method of claim 1, wherein the first surface of the substrate has a surface roughness (Rq) of about less than 0.6 nm upon removal of the mask.

5. The method of claim 1, wherein a second surface of the substrate opposite the first surface of the substrate is masked during etching.

6. The method of claim 1, wherein the mask is removed by oxidation.

7. The method of claim 1, wherein the via is blind via or a through via.

8. The method of claim 1, wherein the mask is selectively applied to the first surface of the substrate such that the damage region is unmasked.

9. The method of claim 1, wherein the substrate is a glass, ceramic, or glass-ceramic.

10. The method of claim 1, further comprising:
    removably bonding the substrate to a carrier by disposing the first surface of the substrate on a bonding surface of the carrier.

11. The method of claim 10, further comprising, after removably bonding the substrate to the carrier, processing the substrate by at least one of applying alkaline cleaning solutions to the substrate, wet etching the substrate, polishing the substrate, metal plating the substrate, metal patterning the substrate by wet etching, depositing material onto the substrate, and annealing the substrate.

12. The method of claim 11, further comprising removing the carrier from the substrate.

13. The method of claim 10, wherein the substrate is removably bonded to the carrier using Van der Waals forces.

* * * * *